(12) United States Patent
Ohtsuki et al.

(10) Patent No.: US 9,106,856 B2
(45) Date of Patent: Aug. 11, 2015

(54) SOLID-STATE IMAGING DEVICE AND IMAGING APPARATUS

(71) Applicant: PANASONIC CORPORATION, Osaka (JP)

(72) Inventors: Hirohisa Ohtsuki, Toyama (JP); Masashi Murakami, Kyoto (JP)

(73) Assignee: PANASONIC INTELLECTUAL PROPERTY MANGEMENT CO., LTD., Osaka (JP)

( * ) Notice: Subject to any disclaimer, the term of this patent is extended or adjusted under 35 U.S.C. 154(b) by 0 days.

(21) Appl. No.: 14/293,770

(22) Filed: Jun. 2, 2014

(65) Prior Publication Data

US 2014/0267858 A1 Sep. 18, 2014

Related U.S. Application Data

(63) Continuation of application No. PCT/JP2012/007085, filed on Nov. 5, 2012.

(30) Foreign Application Priority Data

Dec. 8, 2011 (JP) ................................. 2011-268855

(51) Int. Cl.
*H04N 9/083* (2006.01)
*H04N 3/14* (2006.01)
(Continued)

(52) U.S. Cl.
CPC .......... *H04N 5/369* (2013.01); *H01L 27/14603* (2013.01); *H01L 27/14609* (2013.01); *H01L 27/14641* (2013.01); *H04N 5/378* (2013.01); *H04N 5/3745* (2013.01)

(58) Field of Classification Search
CPC ..... H04N 5/3745; H04N 5/378; H04N 5/369; H01L 27/14609; H01L 27/14641; H01L 27/14603
USPC ................................... 348/294–324, 272–275
See application file for complete search history.

(56) References Cited

U.S. PATENT DOCUMENTS 5,132,803 A * 7/1992 Suga et al. .................... 348/315
6,169,317 B1 * 1/2001 Sawada et al. ................ 257/435
(Continued)

FOREIGN PATENT DOCUMENTS

| JP | 2001-024948 A | 1/2001 |
|---|---|---|
| JP | 2004-172950 A | 6/2004 |

(Continued)

OTHER PUBLICATIONS

International Search Report issued in International Application No. PCT/JP2012/007085 with Date of mailing Dec. 25, 2012, with English Translation.

*Primary Examiner* — Chia-Wei A Chen
(74) *Attorney, Agent, or Firm* — McDermott Will & Emery LLP

(57) ABSTRACT

A solid-state imaging device includes: an imaging region; a peripheral circuit region; photodiodes arranged in rows and columns in the imaging region; output circuits in the imaging region for outputting, to the outside of the imaging region, pixel signals corresponding to electric charges photoelectrically converted in the photodiodes; a read circuit in the peripheral circuit region for reading the pixel signals from the imaging region; and signal lines extending in a column direction to connect output circuits to the read circuit. One pixel cell includes two photodiodes adjacent in a row direction and an output circuit. An output circuit in a first pixel cell is adjacent, in the row direction, to a second pixel cell adjacent to the first pixel cell in the column direction and shifting from the first pixel cell by one column of the photodiodes in the row direction.

15 Claims, 19 Drawing Sheets

(51) Int. Cl.
*H04N 5/335* (2011.01)
*H04N 9/04* (2006.01)
*H04N 5/369* (2011.01)
*H01L 27/146* (2006.01)
*H04N 5/3745* (2011.01)
*H04N 5/378* (2011.01)

(56) References Cited

U.S. PATENT DOCUMENTS

| | | | |
|---|---|---|---|
| 6,878,977 B1 * | 4/2005 | Kozuka et al. | 257/184 |
| 7,429,722 B2 | 9/2008 | Sekine et al. | |
| 7,671,912 B2 | 3/2010 | Abe et al. | |
| 7,902,512 B1 * | 3/2011 | Chang et al. | 250/370.01 |
| 7,952,636 B2 * | 5/2011 | Ikeda et al. | 348/311 |
| 8,125,547 B2 * | 2/2012 | Oda et al. | 348/277 |
| 8,125,553 B2 | 2/2012 | Mori et al. | |
| 8,482,643 B2 | 7/2013 | Abe et al. | |
| 8,792,029 B2 * | 7/2014 | Lee | 348/278 |
| 8,817,141 B2 * | 8/2014 | Tanaka | 348/273 |
| 2001/0048477 A1 * | 12/2001 | Misawa | 348/272 |
| 2004/0201760 A1 * | 10/2004 | Ota et al. | 348/272 |
| 2006/0001751 A1 | 1/2006 | Abe et al. | |
| 2006/0231739 A1 | 10/2006 | Sekine et al. | |
| 2007/0164335 A1 * | 7/2007 | McKee | 257/294 |
| 2009/0201405 A1 | 8/2009 | Mori et al. | |
| 2010/0110243 A1 | 5/2010 | Abe et al. | |
| 2010/0110244 A1 | 5/2010 | Abe et al. | |
| 2010/0225795 A1 * | 9/2010 | Suzuki et al. | 348/300 |
| 2013/0265471 A1 | 10/2013 | Abe et al. | |
| 2014/0218580 A1 * | 8/2014 | Mayer et al. | 348/308 |
| 2014/0333810 A1 * | 11/2014 | Nakaseko | 348/294 |
| 2015/0092094 A1 * | 4/2015 | Itonaga et al. | 348/300 |

FOREIGN PATENT DOCUMENTS

| | | |
|---|---|---|
| JP | 2006-302970 A | 11/2006 |
| JP | 2009-026984 A | 2/2009 |
| JP | 2009-188049 A | 8/2009 |
| WO | 2004/047428 A1 | 6/2004 |

* cited by examiner

VDD  SIG

▨ Second line layer

SOLID-STATE IMAGING DEVICE AND IMAGING APPARATUS

CROSS REFERENCE TO RELATED APPLICATIONS

This is a continuation application of PCT International Application No. PCT/JP2012/007085 filed on Nov. 5, 2012, designating the United States of America, which is based on and claims priority of Japanese Patent Application No. 2011-268855 filed on Dec. 8, 2011. The entire disclosures of the above-identified applications, including the specifications, drawings and claims are incorporated herein by reference in their entirety.

FIELD

The present disclosure relates to solid-state imaging devices and imaging apparatuses, and more particularly to an arrangement of photodiodes and output circuits in the solid-state imaging device.

BACKGROUND

In recent years, with the increase of pixels and the reduction of chip sizes, various imaging devices with reduced pixel sizes have been developed. The following describes a conventional solid-state imaging device with reference to Patent Literature 1 (PLT 1).

FIG. 24 is a plan view of a pixel array part in a conventional solid-state imaging device. In this figure, in each of pixels which are two-dimensionally arranged, a photodiode (corresponding one of PD11 to PD44) and a transfer gate (corresponding one of TG11 to TG44) are arranged. Two photodiodes adjacent in a vertical direction (up-down direction) share an output circuit that includes a floating junction FJ, a reset transistor RS, and a drive transistor D. In the output circuit, the floating junction FJ is connected to a gate of the drive transistor D.

Each of the transfer gates TG11 to TG14, TG21 to TG24, TG31 to TG34, and TG41 to TG44 is connected to a corresponding one of read lines LTG1 to LTG4 extending in a horizontal direction (left-right direction). A gate of each of the reset transistors RS is connected to a corresponding one of reset lines RSL01 to RSL45 extending in the horizontal direction. A drain of each of the drive transistors D and a drain of each of the reset transistors RS are connected to a corresponding one of reset drains RD extending in the vertical direction. A source of each of the drive transistors D is connected to a corresponding one of signal lines S1 to S4 extending in the vertical direction.

In the solid-state imaging device according to PLT 1, a plurality of unit cells each including two photodiodes adjacent in the vertical direction are arranged in a check-like pattern, and each of the output circuits is provided between each pair of unit cells adjacent in the vertical direction. As a result, the solid-state imaging device according to PLT 1 enhances integration in the horizontal direction.

CITATION LIST

Patent Literature

[PLT 1] Japanese Unexamined Patent Application Publication No. 2006-302970

SUMMARY

Technical Problem

However, in the conventional solid-state imaging device, each of the output circuits is provided between each pair of cells adjacent in the vertical direction, and the signal lines S1 to S4 are provided to extend in the column direction. Therefore, the signal lines S1 to S4 and the reset drains RD need to have parts extending also in the horizontal direction. As a result, the horizontal parts of the lines are crowded around each of the output circuits, which fails to refine pixels.

In order to solve the above problem, one non-limiting and exemplary embodiment provides a solid-state imaging device in which pixels are refined by reducing an area for lines and optimizing a line layout.

Solution to Problem

In accordance with an aspect of the present disclosure in order to solve the above problem, there is provided a solid-state imaging device, including: a semiconductor substrate that includes an imaging region and a peripheral circuit region; a plurality of photodiodes arranged in rows and columns in the imaging region; a plurality of output circuits provided in the imaging region to transfer electric charges photoelectrically converted in the photodiodes and output pixel signals corresponding to the electric charges to outside of the imaging region; a read circuit provided in the peripheral circuit region to read the pixel signals from the imaging region; and a plurality of signal lines extending in a column direction above the semiconductor substrate to transfer the pixel signals, wherein each of the signal lines connects two or more output circuits among the output circuits to the read circuit, two photodiodes adjacent at least in a row direction among the photodiodes and an output circuit among the output circuits are included in a corresponding one of pixel cells, the pixel cells include a first pixel cell and a second pixel cell, the first pixel cell and the second pixel cell being adjacent to each other in a column direction and shifting from each other by one column of the photodiodes in the row direction, and the output circuit in the first pixel cell is adjacent to the second pixel cell in the row direction.

With the above structure, a distance between an output circuit in the first pixel cell and an output circuit in the second pixel cell is shorter than a distance between output circuits in two pixel cells which are arranged side by side not shifting in the row direction. As a result, it is possible to decrease a length of the signal lines in the column direction. Furthermore, in order to connect output circuits together in the first pixel cell and the second pixel cell which shift from each other in the row direction, parts of the signal line extend also in the row direction, parts of the signal line extend also in the row direction. With the above structure, each of the signal line extends not only in the column direction but also in the row direction, so that the signal lines are homogeneously arranged without being concentrated on specific positions. It is therefore possible to increase a line opening, thereby refining pixels with a high manufacturing accuracy.

Advantageous Effects

In the solid-state imaging device according to the present disclosure, it is possible to reduce a line area in an imaging region and optimize a line layout, thereby refining pixels.

DESCRIPTION OF EMBODIMENT(S)

The following describes embodiments in detail with reference to the Drawings.

It should be noted that all the embodiments described below are generic and specific examples of the present disclosure. Numerical values, shapes, constituent elements, arrangement positions and the connection configuration of the constituent elements, and the like described in the following embodiments are merely examples. They are therefore not intended to limit the present disclosure. Therefore, among the constituent elements in the following embodiments, constituent elements that are not described in independent claims that show the most generic concept of the present disclosure are described as elements constituting more desirable configurations.

(Embodiment 1)

Figure 1:
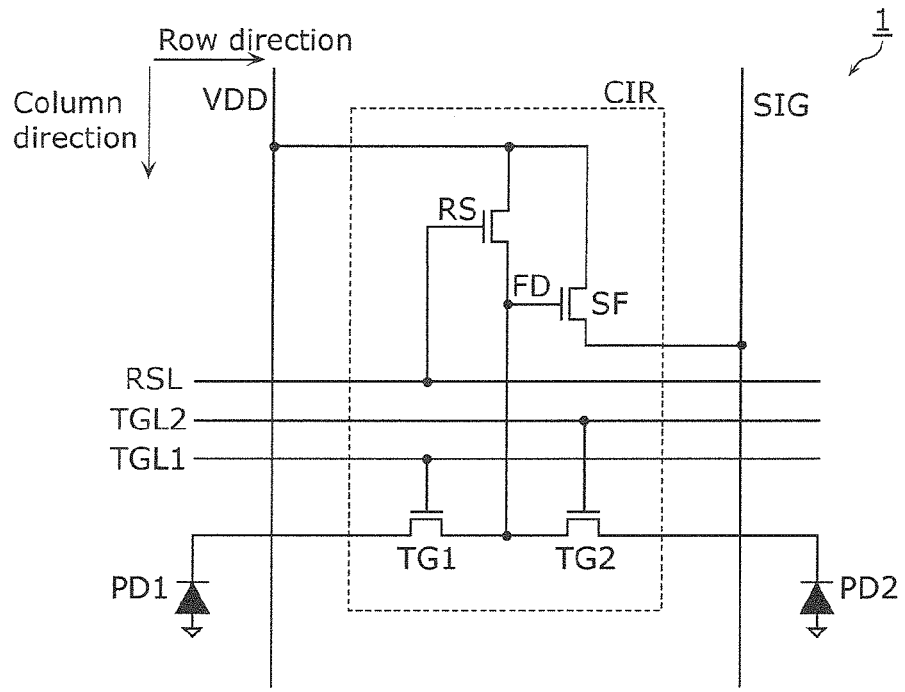
FIG. 1 is a circuit diagram of a pixel cell in a solid-state imaging device according to Embodiment 1.

FIG. 1 is a circuit diagram schematically illustrating one of pixel cells in an imaging region of a solid-state imaging device according to Embodiment 1. As illustrated in FIG. 1, a pixel cell 1 includes: two photodiodes PD1 and PD2 adjacent in a row direction (horizontal direction); and a single output circuit CIR provided between the photodiodes PD1 and PD2.

The output circuit CIR includes: transfer transistors TG1 and TG2 which select the photodiode PD1 and the photodiode PD2, respectively; a floating diffusion FD in which electric charges transferred from the photodiodes PD1 and PD2 are temporarily stored; an amplification transistor SF that outputs a signal to a signal line SIG according to a potential of the floating diffusion FD; and a reset transistor RS that resets the potential of the floating diffusion FD. The signal line SIG which transfers the pixel signal extends in a column direction (vertical direction) between the photodiodes adjacent in the row direction.

The amplification transistor SF and the reset transistor RS are connected to the same power source line VDD. The power source line VDD extends in the column direction between the photodiodes adjacent in the row direction.

A gate of the reset transistor RS is connected to a reset line RSL. The reset line RSL extends in the row direction between photodiodes which are included in the columns close to one another.

The transfer transistors TG1 and TG2 correspond to the two photodiodes PD1 and PD2, respectively, which are adjacent in the row direction in the pixel cell 1. Gates of the transfer transistors TG1 and TG2 are connected to transfer transistor control lines TGL1 and TGL2, respectively, which extend in the row direction. The transfer transistor control lines TGL1 and TGL1 extend in the row direction between photodiodes which are included in the columns close to one another.

With the above structure, the output circuit CIR transfers electric charges which have been photoelectrically converted by the photodiodes, so as to output a pixel signal corresponding to the transferred charges to the outside of the imaging region 2.

Figure 2:
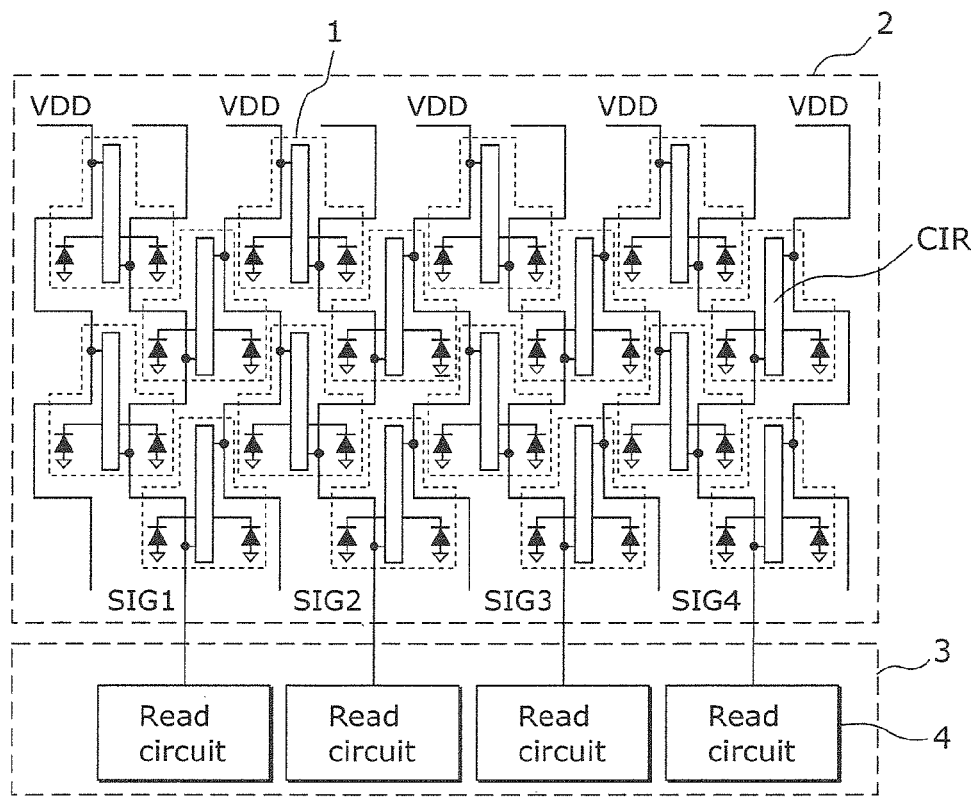
FIG. 2 is a circuit diagram of a pixel array in the solid-state imaging device according to Embodiment 1.

FIG. 2 is a circuit diagram of a pixel array including an imaging region and a peripheral circuit region in the solid-state imaging device according to Embodiment 1. The solid-state imaging device according to the present embodiment includes an imaging region 2 and a peripheral circuit region 3 in/on a semiconductor substrate. In the imaging region 2, pixel cells 1 are arranged in an array. In the peripheral circuit region 3, read circuits 4 are arranged. A plurality of photodiodes are arranged in the imaging region 2 to form a matrix.

The read circuits 4 are provided in the peripheral circuit region 3. Each of the read circuits 4 has a function of reading the above-described pixel signals from the imaging region 2.

Each of signal lines SIG1 to SIG4 connects two or more output circuits among the output circuits CIR to a corresponding one of the read circuits 4.

As illustrated in FIG. 2, the pixel cells 1 in an array are arranged in a houndstooth-like pattern, in which two pixel cells 1 which are adjacent to each other in the column direction shift from each other by one photodiode in the row direction. Furthermore, an output circuit in one of the two pixel cells 1 which are adjacent to each other in the column direction is adjacent to the other one of the two pixel cells in the row direction. Each of the output circuits CIR is connected to one of the signal lines SIG1 to SIG4 and connected to one of power source lines VDD. In the present embodiment, depending on the above-described arrangement, the signal lines SIG1 to SIG4 are arranged in a meander pattern so that output circuits CIR in the two pixel cells 1 adjacent to each other in the column direction are connected to the same signal line. Furthermore, the power source lines VDD are arranged in a meander pattern so that output circuits CIR in other two pixel cells 1 adjacent to each other in the column direction are connected to the same power source line VDD.

It should be noted that the above expression "arranged in a houndstooth-like pattern, in which two pixel cells 1 which are adjacent to each other in the column direction shift from each other by one photodiode in the row direction" means "arranged in a houndstooth-like pattern, in which two pixel cells 1 which are adjacent to each other in the column direction shift from each other by one column of photodiodes in the row direction".

In this case, as illustrated in FIG. 2, for each of the output circuits CIR, a position connected to the signal line (one of SIG1 to SIG4) and a position connected to the power source line VDD are in different rows. In short, such connection positions are arranged in a meander pattern. As a result, the lines extending in the column directions are homogeneously arranged without being concentrated on specific positions.

Furthermore, each of the signal lines SIG connected to respective pixel cells 1 arrayed in the imaging region 2 is connected to a corresponding one of the read circuits 4 arranged in the peripheral circuit region 3 provided at the end of the pixel array in the column direction. Each of the read circuits 4 is provided for two columns of photodiodes. This connection relationship among the signal lines SIG and the read circuits 4 can decrease the number of the read circuits 4 and reduce an area of the peripheral circuit region 3.

Figure 3A:
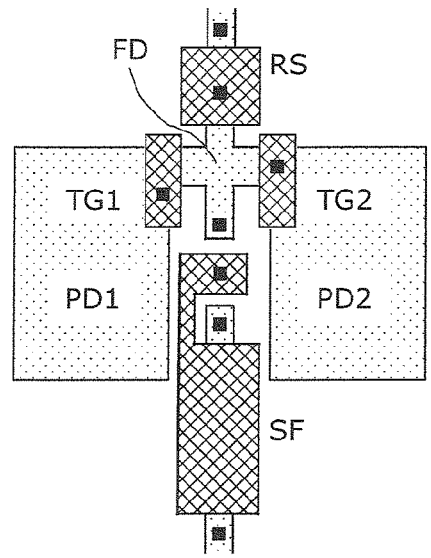
FIG. 3A is a layout diagram of active regions and polysilicon gates in a semiconductor substrate in a pixel cell according to Embodiment 1.
Figure 3B:
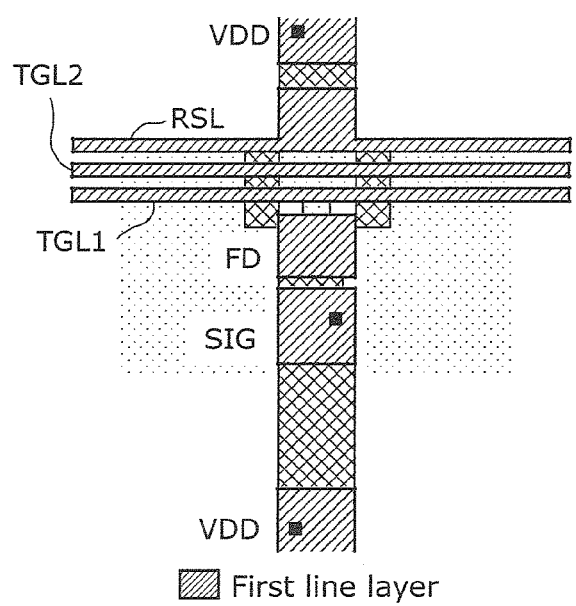
FIG. 3B is a layout diagram of a first line layer in an insulating film on the semiconductor substrate in a pixel cell according to Embodiment 1.
Figure 3C:
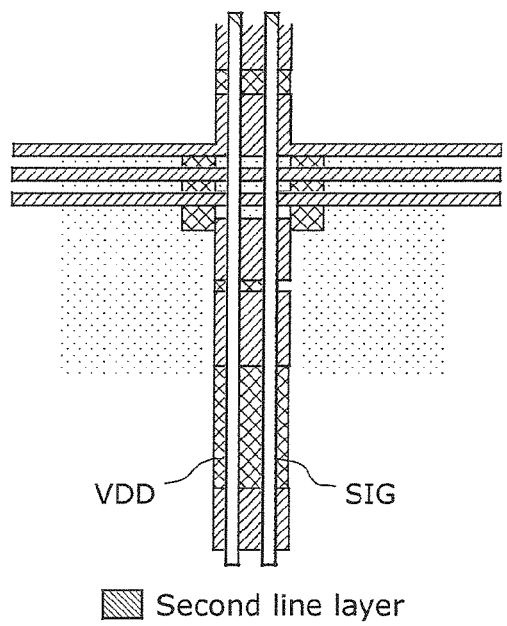
FIG. 3C is a layout diagram of a second line layer in an insulating film on the first line layer in a pixel cell according to Embodiment 1.

Each of FIGS. 3A to 3C is a layout diagram illustrating structural elements arranged in a single pixel cell 1. FIG. 3A is a layout diagram of active regions OF the semiconductor substrate and polysilicon gates on the semiconductor substrate in a pixel cell 1. FIG. 3B is a layout diagram of a first line layer in an insulating film on the semiconductor substrate in the pixel cell 1 FIG. 3C is a layout diagram of a second line layer in an insulating film on the first line layer in the pixel cell 1.

Figure 4:
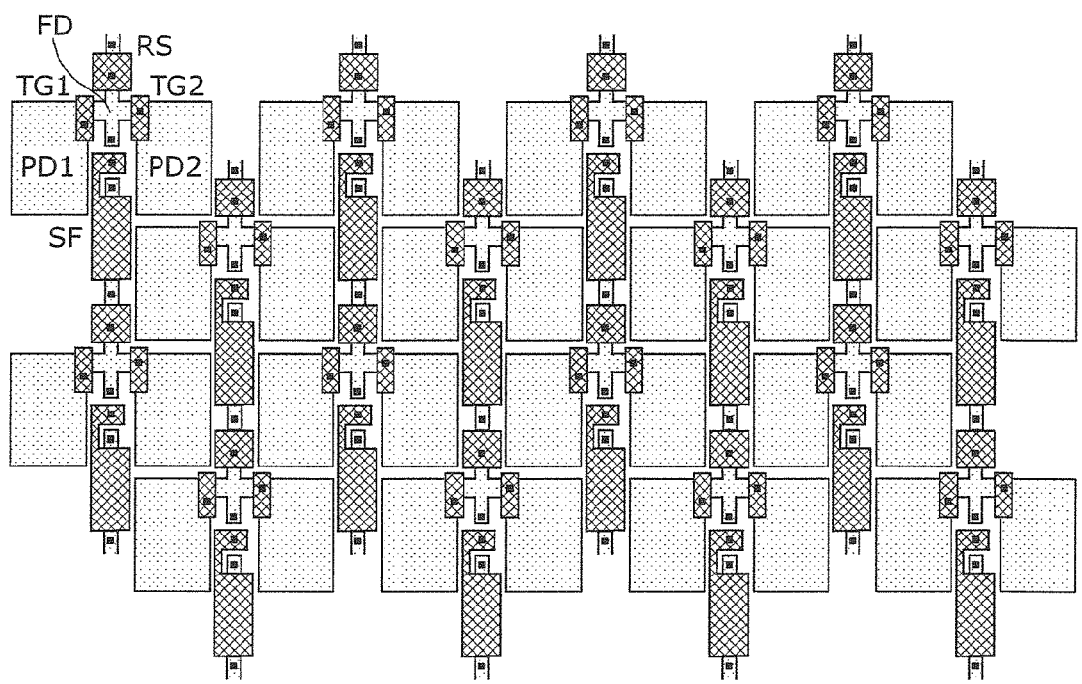
FIG. 4 is a layout diagram of active regions and polysilicon gates in the semiconductor substrate in a pixel array according to Embodiment 1.
Figure 5:
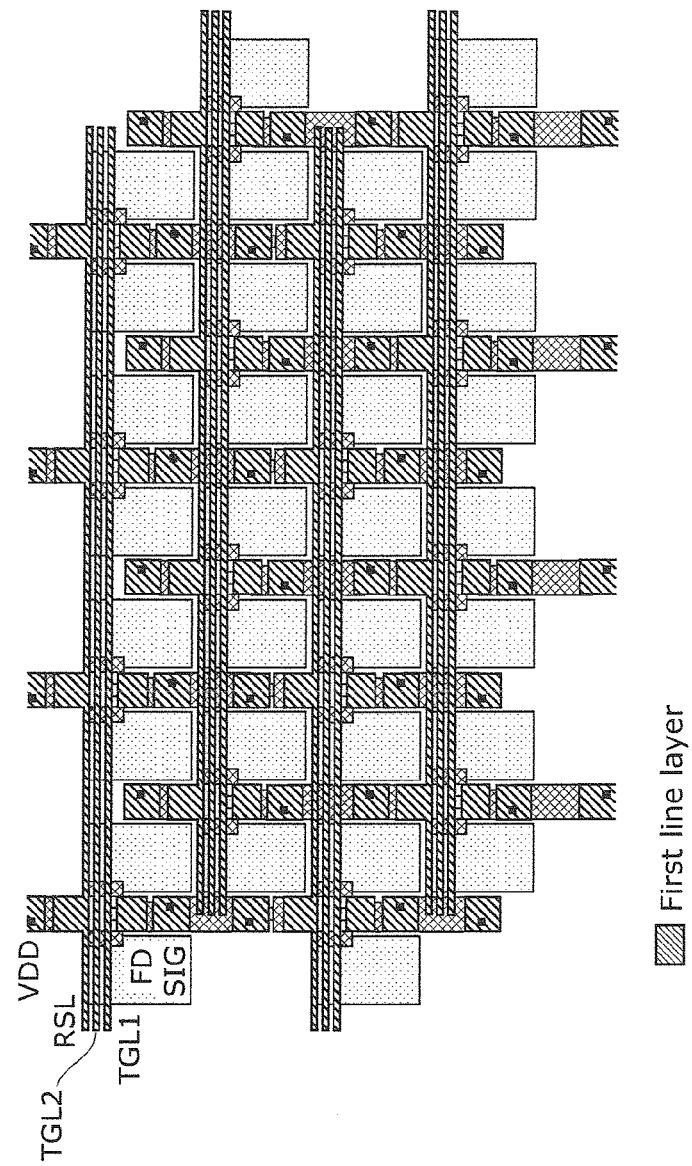
FIG. 5 is a layout diagram of the first line layer in a pixel array according to Embodiment 1.
Figure 6:
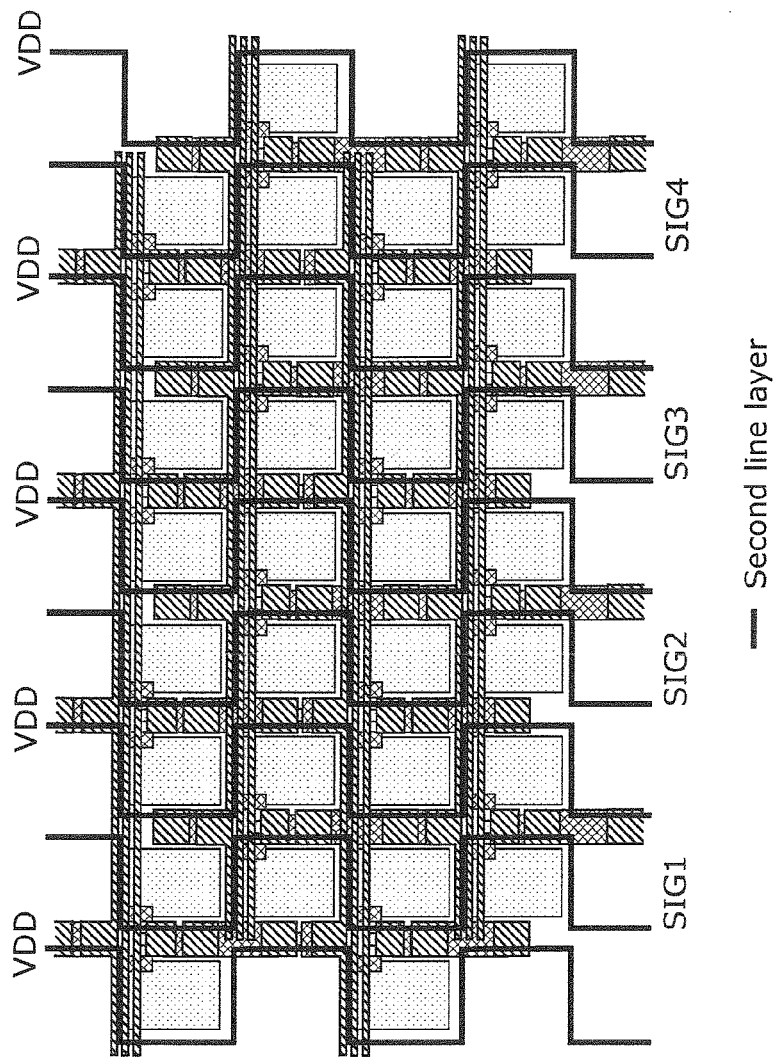
FIG. 6 is a layout diagram of the second line layer in a pixel array according to Embodiment 1.

FIG. 4 is a layout diagram of active regions and polysilicon in the case where a plurality of the pixel cells 1 illustrated in FIG. 3A are arranged in an array. FIG. 5 is a layout diagram of the first line layer in the case where a plurality of the pixel cells 1 illustrated in FIG. 3B are arranged in an array. FIG. 6 is a layout diagram of the second line layer in the case where a plurality of the pixel cells 1 illustrated in FIG. 3C are arranged in an array.

As illustrated in FIGS. 3A and 4, the transfer transistor TG1 is provided at the right upper part of the photodiode PD1, and the transfer transistor TG2 is provided at the left upper part of the photodiode PD2.

Furthermore, the transfer transistors TG1 and TG2, the reset transistor RS, and the amplification transistor SF are provided on a continuous diffusion layer. For example, if an electron is used as a signal, an impurity is diffused in the semiconductor substrate to be an N type. Since a drain of the reset transistor RS is a source of the amplification transistor SF, the power source line VDD can be connected to the diffusion layer via the drain/source only.

Furthermore, as illustrated in FIGS. 3B and 5, the diffusion layer is connected to the gate of the amplification transistor SF through the first line layer via a contact. As described above, since the line for the floating diffusion FD is provided between photodiodes adjacent in the row direction, it is possible to form line connecting without concentrating lines extending in the row direction.

Furthermore, as illustrated in FIGS. 3B and 5, the transfer transistor control lines TGL1 and TGL2 and the reset line RSL are arranged in parallel in the row direction in the first line layer. Here, the gates of the transfer transistors TG1 and TG2 are provided below the transfer transistor control lines TGL1 and TGL2, respectively. The gates of the transfer transistors TG1 and TG2 are connected to the transfer transistor control lines TGL1 and TGL2, respectively, via contacts.

Furthermore, as illustrated in FIGS. 3C and 6, the signal line SIG is connected to the source of the amplification transistor SF in the first line layer, and the power source line VDD is connected to the drain of the amplification transistor SF in the first line layer. The signal line SIG and the power source line VDD are arranged to extend in the column direction in the second line layer. In FIG. 3C, the power source line VDD and the signal line SIG are connected to the output circuit CIR in the same row. In FIG. 6, each of the signal lines SIG and the power source lines VDD meanders around pixel cells 1 arranged in a houndstooth-like pattern. This layout can homogeneously arrange the lines extending in the column direction without being concentrated on specific positions.

The effects of the pixel cells 1 arranged in the above manner are described.

In the above layout, an output circuit in a first pixel cell is adjacent to a second pixel cell in the row direction. Here, the second pixel cell is adjacent to the first pixel cell in the column direction, and shifts from the first pixel cell by one column of photodiodes in the row direction. In other words, a distance between the output circuit in the first pixel cell and an output circuit in the second pixel cell is shorter than a distance between output circuits in two pixel cells which are arranged side by side not shifting from each other in the row direction. As a result, it is possible to decrease a length of the signal lines in the column direction. Furthermore, in order to connect output circuits together in two pixel cells which shift from each other in the row direction, parts of the signal line extend also in the row-direction. As a result, the lines that used to extend only in the column direction are homogeneously arranged in the imaging region both in the column direction and in the row direction. It is therefore possible to increase a line opening (in other words, a connection window for connecting lines in different layers), thereby refining the pixels with a high manufacturing accuracy.

The transfer transistor control lines TGL1 and TGL2 and the reset line RSL extending in parallel in the row direction are arranged only in the first line layer. The signal line SIG and the power source line VDD are connected to the transfer transistor control lines TGL1 and TGL2 and the reset line RSL in the first line layer. The signal line SIG and the power source line VDD are arranged to extend in the column direction in the second liner layer. As a result, since there is no part where lines are concentrated, it is possible to increase a line opening, thereby refining the pixels with a high manufacturing accuracy.

Furthermore, the transfer transistor control lines TGL1 and TGL2 and the reset line RSL can be formed in a simple pattern in which these lines with the same line width are arranged in parallel in the row direction. This pattern can stabilize the shape, thereby offering more refined manufacturing. As a result, it is possible to increase a line opening, thereby refining the pixels with a high manufacturing accuracy.

Furthermore, the signal lines SIG and the power source lines VDD meander according to the houndstooth-like pattern of the pixel cells. Therefore, by using a single line in the second line layer between areas not provided with lines, it is possible to increase a line opening, thereby refining the pixels with a high manufacturing accuracy.

Furthermore, in the present embodiment, it is possible to reduce the number of the signal lines SIG to one for two columns of photodiodes. As a result, it is possible to provide a single read circuit 4, which outputs signals from pixel cells 1 to the outside, for two columns of photodiodes. As a result, it is possible to reduce an area for the read circuits 4, thereby reducing a size of the peripheral circuit region 3, and eventually reducing a chip size. Moreover, it is possible to increase the number of products manufactured from one wafer, thereby reducing a cost.

(Embodiment 2)

Figure 7:
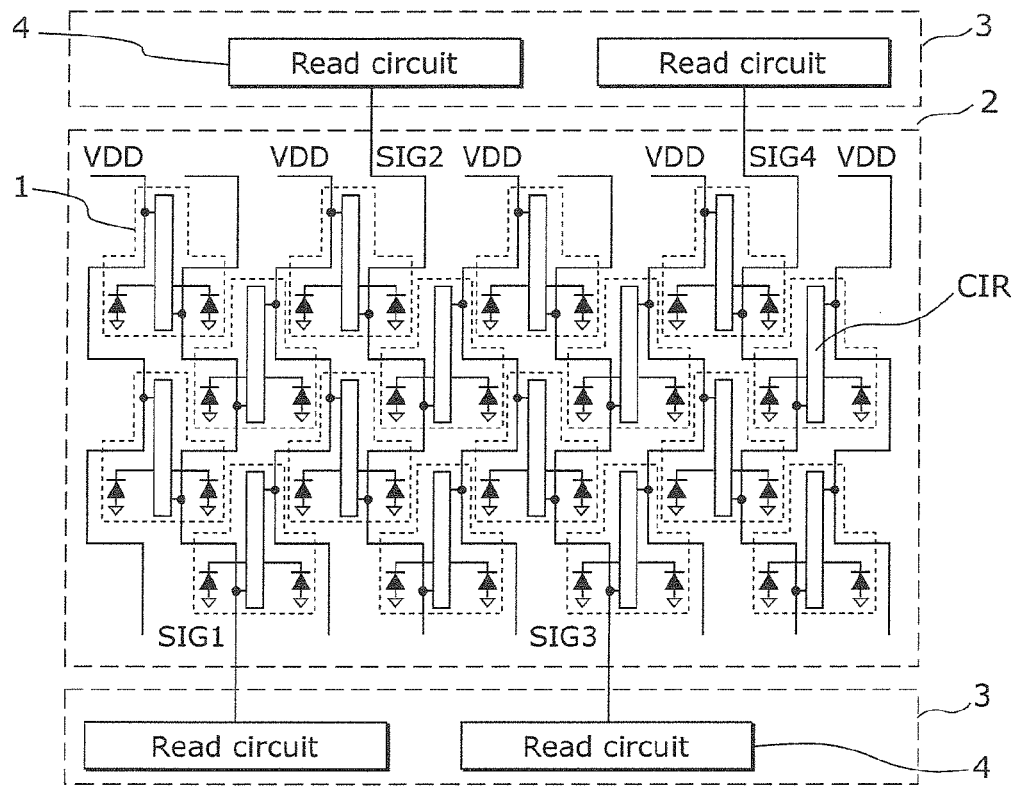
FIG. 7 is a circuit diagram of a pixel array in a solid-state imaging device according to Embodiment 2.

FIG. 7 is a circuit diagram illustrating pixel cells 1 arranged in an array in a solid-state imaging device according to Embodiment 2. Embodiment 2 differs from Embodiment 1 in that read circuits 4 are arranged above and under the pixel array, and one read circuit 4 is provided for four columns of photodiodes.

The structure of the pixel array according to Embodiment 2 is the same as the structure of the pixel array according to Embodiment 1 so that Embodiment 2 can achieve the pixel refinement in the same manner as described in Embodiment 1.

Furthermore, since one read circuit 4 is provided for four columns of photodiodes, a flexibility of arranging the read circuits 4 is further increased, and the arrangement area for the read circuits 4 is further reduced. As a result, it is possible to further increase the number of products manufactured from one wafer, thereby further reducing a cost.

Although the read circuits 4 are arranged alternately above and under the pixel array in Embodiment 2, the arrangement of the read circuits 4 is not limited to this. It is also possible that the read circuits 4 are arranged alternately above and under the pixel array for every two signal lines SIG. Furthermore, although the same number of read circuits 4 are provided above and under the pixel array in Embodiment 2, it is also possible that the number of read circuits 4 above the pixel array is different from the number of read circuits 4 under the pixel array depending on how an AD converter provides outputs to the outside. The flexibility in the arrangement includes the above-described variations.

(Embodiment 3)

Figure 8:
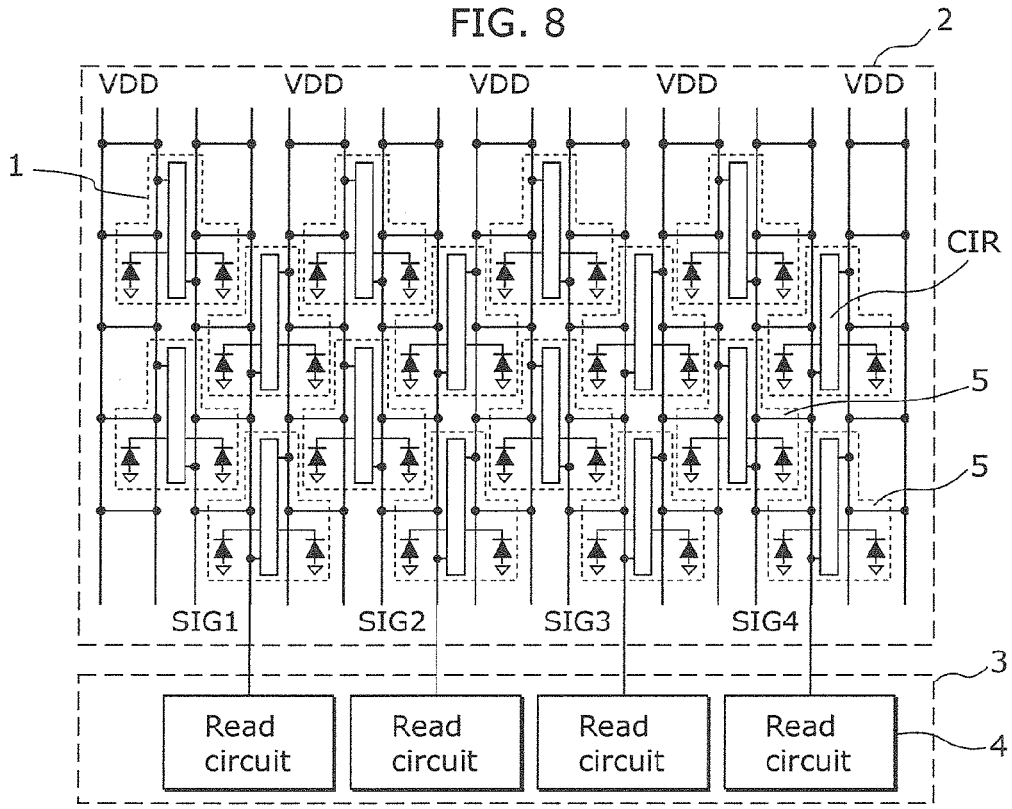
FIG. 8 is a circuit diagram of a pixel array in a solid-state imaging device according to Embodiment 3.
Figure 9:
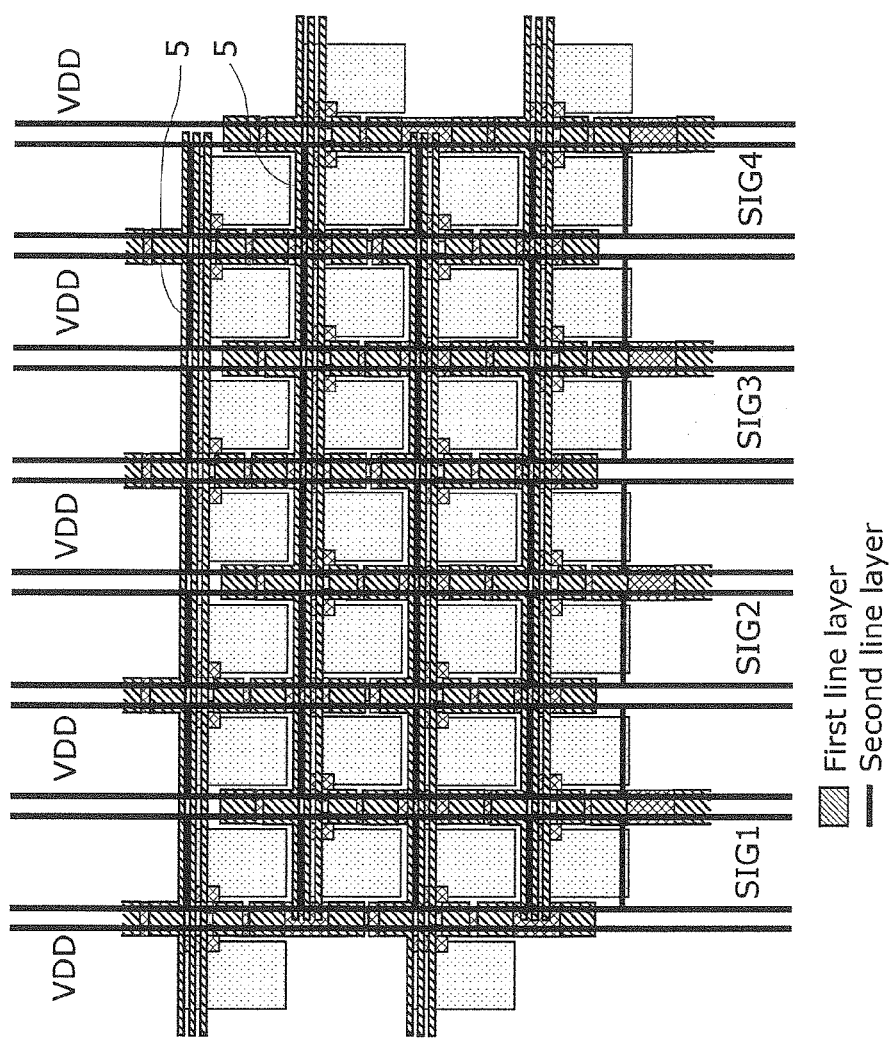
FIG. 9 is a layout diagram of a second line layer in the pixel array according to Embodiment 3.

FIG. 8 is a circuit diagram illustrating pixel cells 1 arranged in an array in a solid-state imaging device according to Embodiment 3. FIG. 9 is a layout diagram of a second line layer in the circuit diagram according to Embodiment 3. The structure up to the first line layer is the same between Embodiment 3 and Embodiment 1. However, Embodiment 3 differs from Embodiment 1 in that the signal lines SIG1 to SIG4 and the power source lines VDD in the second line layer are arranged in a ladder pattern.

Here, the ladder pattern means that a pair of power source lines VDD or a pair of signal lines (one of SIG1 to SIG4) extends in the column direction between each pair of adjacent columns of photodiodes, and bridge lines 5 extend in the row direction between each pair of adjacent rows of photodiodes to connect the pair of lines. Although the bridge line 5 is provided for each row in Embodiment 3, it is possible that the bridge lines 5 are arranged in a houndstooth-like pattern according to the houndstooth-like pattern of the pixel cells 1.

In other words, a first signal line connected to an output circuit in one of two pixel cells adjacent to each other in the column direction is connected to a second signal line connected to an output circuit in the other one of the two pixel cells, via a bridge line 5 which extend in the row direction above the photodiodes adjacent in the column direction.

The structure of the pixel array according to Embodiment 3 is the same as the structure of the pixel array according to Embodiment 1 so that Embodiment 3 can achieve the pixel refinement in the same manner as described in Embodiment 1.

Moreover, since the signal lines SIG1 to SIG4 and the power source lines VDD in the second line layer are arranged in a ladder patter, it is possible to reduce line resistance and increase a speed for reading.

(Embodiment 4)

Figure 10:
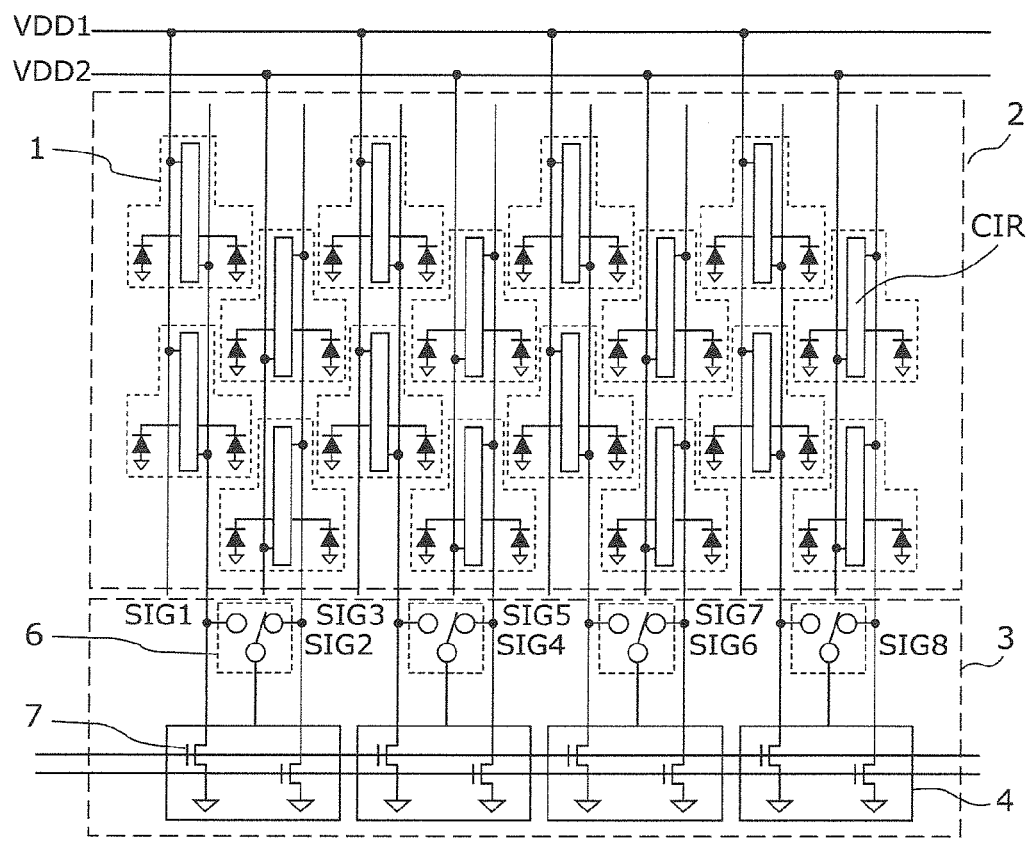
FIG. 10 is a circuit diagram of a pixel array in a solid-state imaging device according to Embodiment 4.
Figure 11:
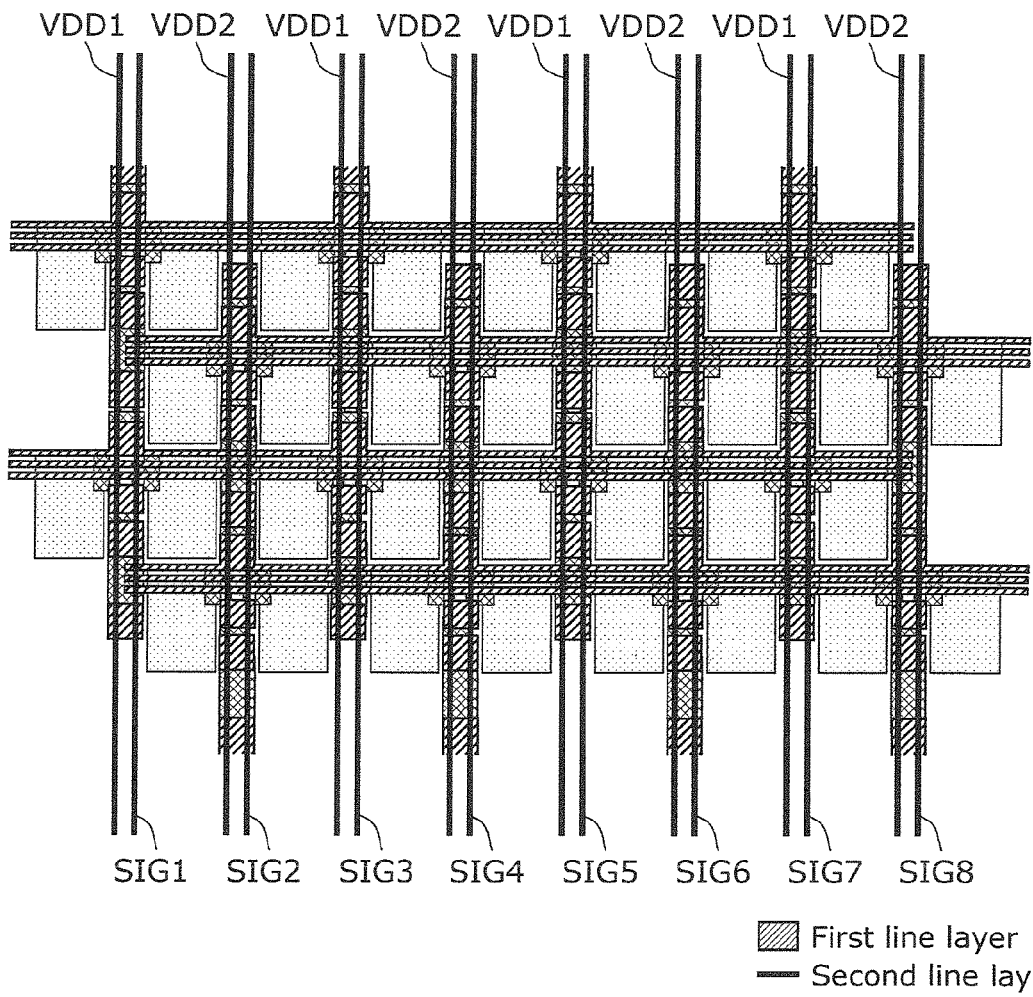
FIG. 11 is a layout diagram of a second line layer in the pixel array according to Embodiment 4.

FIG. 10 is a circuit diagram illustrating pixel cells 1 arranged in an array in a solid-state imaging device according to Embodiment 4. FIG. 11 is a layout diagram of a second line layer in the circuit diagram according to Embodiment 4. The structure up to the first line layer is the same between Embodiment 4 and Embodiment 1. However, Embodiment 4 differs from Embodiment 1 in that a signal line (one of SIG1 to SIG8) and a power source line VDD in the second line layer is provided for each column of photodiodes.

Output circuits in two pixel cells adjacent to each other in the column direction are connected to different signal lines. The two different signal lines are connected to the same read circuit 4, so that each read circuit 4 is provided for two signal lines.

Furthermore, output circuits in two pixel cells adjacent to each other in the row direction are connected to different power source lines. The different power source lines are provided alternately in the row direction. Therefore, it is possible to apply different power-source voltages to the respective power source lines.

Furthermore, between each of the signal lines SIG1 to SIG8 and a corresponding one of the read circuits 4, there is a switch 6. Each of such switches 6 is provided for the two different signal lines (two of SIG1 to SIG8) to select a signal line to be used in reading, between the two different signal lines.

Moreover, each of the signal lines SIG1 to SIG8 for respective columns is connected to a corresponding one of load transistors 7 in a corresponding one of the read circuits 4. More specifically, one of two different signal lines, each of which is connected to output circuits included in a corresponding one of the two pixel cells adjacent to each other in the column direction, is connected to a first load transistor, while the other one of the two different signal lines is connected to the second load transistor. As a result, the load transistors 7 can control the signal lines independently for respective columns.

Furthermore, the power source line includes power source lines VDD1 and the power source lines VDD2. The power source line VDD1 and the power source line VDD2 are alternately arranged for columns.

The structure of the pixel array according to Embodiment 4 is the same as the structure of the pixel array according to Embodiment 1 so that Embodiment 4 can achieve the pixel refinement in the same manner as described in Embodiment 1.

Moreover, since each of the signal lines SIG1 to SIG8 and the power source lines VDD1 and VDD2 in the second line layer does not meander, a length of lines is decreased. As a result, it is possible to reduce a line resistance and increase a speed for reading.

In addition, Embodiment 4 reduces more parasitic capacitance in lines than Embodiment 3 does. As a result, in a process with a large capacitance between lines, it is possible to increase a speed for reading.

Furthermore, the signal lines SIG1 to SIG8 and the power source lines VDD in the second line layer are arranged in a simple pattern, in which these lines are arranged in parallel in the column direction with the same line width. This pattern provides a regular shape, and more refinement is therefore possible. As a result, it is possible to increase a line opening, thereby refining the pixels.

Still further, in Embodiment 4, the number of the signal lines, which actually perform reading, is decreased to one for two columns of photodiodes. Therefore, by controlling the power source lines VDD1 and VDD2 and the load transistors 7, it is possible not to cause a current to flow in signal lines in columns for which reading is not performed. As a result, it is possible to save energy.

Since the power source lines VDD1 and VDD2 are alternately arranged and independent from each other, it is possible to apply a voltage to the power source lines VDD1 and VDD2 independently. As a result, it is possible to increase a flexibility in mixing pixels.

Although it is illustrated in Embodiment 4 that the read circuits 4 are arranged under the pixel array and one read circuit 4 is provided for two columns of photodiodes, it is possible that the read circuits 4 are arranged above and under the pixel array and one read circuit 4 is provided for two columns of photodiodes. In this case, in the same manner as described in Embodiment 2, it is possible to reduce the arrangement area for the read circuits 4, thereby reducing a cost.

If the read circuits are arranged above and under the pixel array and one read circuit is provided for two columns of photodiodes, it is possible to double a frame rate.

Moreover, by switching the load transistor 7 by using the switch 6, it is possible to prevent a current path from forming in the load transistors 7 that are not driven. As a result, it is possible to prevent voltage effects (IR-Drop) caused by resistance components of the load transistors 7, thereby increasing a dynamic range.

It is also possible, as a variation of Embodiment 4, that the load transistor 7 is provided between the switch 6 and the read circuit 4.

Therefore, since the load transistor 7 is shared by the switch 6 and the read circuit 4, the number of the load transistors 7 is decreased to a half, thereby reducing a chip size.

(Embodiment 5)

Figure 12:
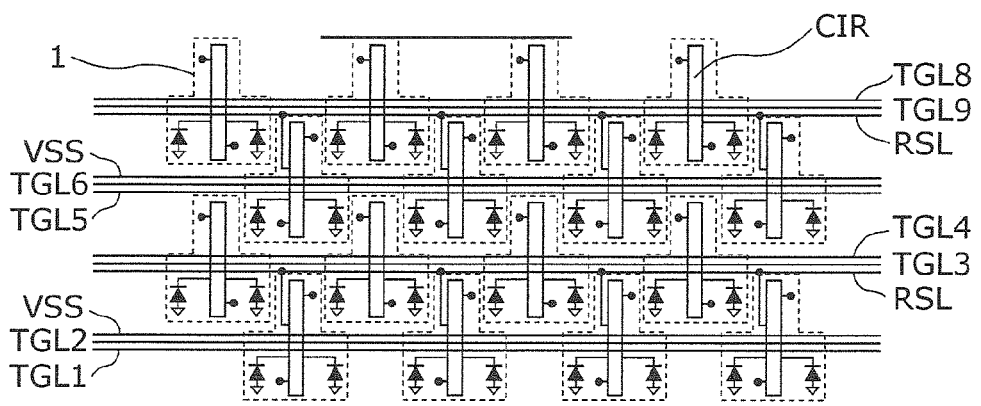
FIG. 12 is a circuit diagram of a pixel array in a solid-state imaging device according to Embodiment 5.
Figure 13:
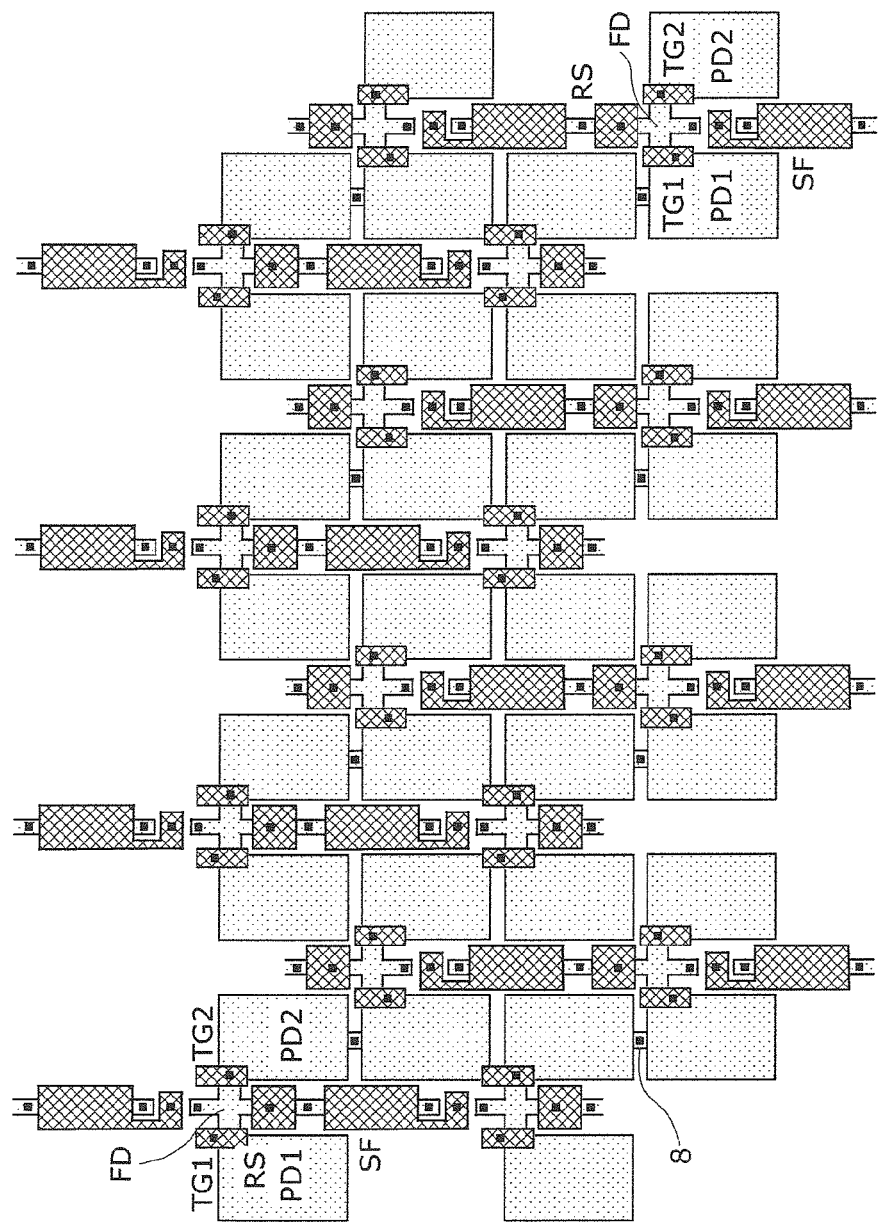
FIG. 13 is a layout diagram of active regions and polysilicon gates in a semiconductor substrate in the pixel array according to Embodiment 5.
Figure 14:
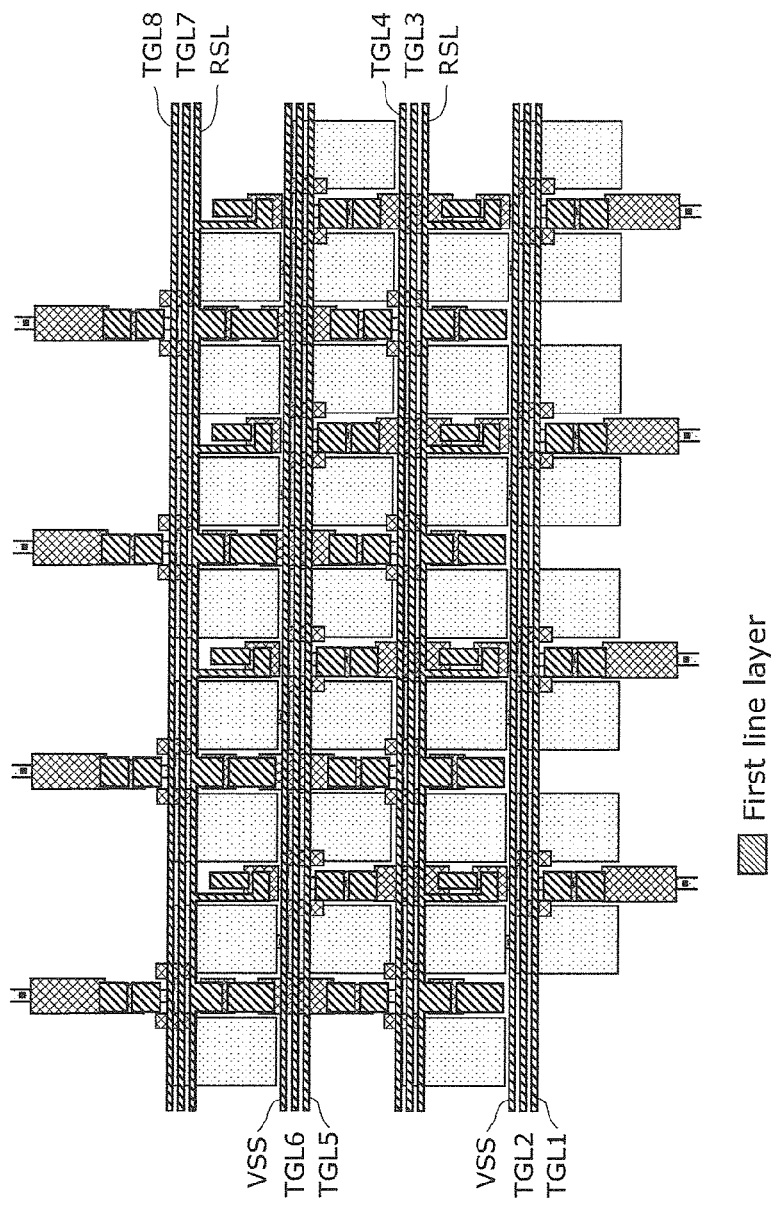
FIG. 14 is a layout diagram of the first line layer in the pixel array according to Embodiment 5.

FIG. 12 is a circuit diagram illustrating pixel cells 1 arranged in an array in a solid-state imaging device according to Embodiment 5. FIG. 13 is a layout diagram of active regions and polysilicon in the circuit diagram according to Embodiment 5. FIG. 14 is a layout diagram of a first line layer in the circuit diagram according to Embodiment 5. Embodiment 5 differs from Embodiment 4 in that the output circuits CIR are arranged in the row direction not in the column direction, and the reset line RSL is shared by pixel cells in two adjacent cell-columns of pixel cells. Furthermore, a ground line VSS for a substrate contact 8 is provided at a part from which a reset line RSL is eliminated. Each of such ground lines VSS extends in the row direction. Each of the ground lines VSS is connected to a region in the imaging region 2. The region is not the region where the output circuits CIR and the photodiodes are arranged. The ground lines VSS are arranged in rows different from rows provided with reset lines RSL.

The substrate contact 8 is an active region having a conduction type opposite from a conduction type of the photodiode and the floating diffusion. If the photodiode is an N type, the substrate contact 8 is a P type.

In Embodiment 5, in the first line layer, three lines of the transfer transistor control lines TGL1 and TGL2 and the reset line RSL or the ground line VSS are arrange in parallel, thereby producing the same effects of Embodiment 1.

Furthermore, the further provision of the ground lines VSS can provide more reliable processing at a higher speed.

Moreover, as a variation of Embodiment 5, it is also possible that ancillary power source lines (not illustrated) are provided in the row direction instead of the ground lines VSS. With the structure, the ancillary power source lines are connected to the power source lines VDD in the second line layer, thereby reducing resistance of the power source lines.

(Embodiment 6)

Figure 15:
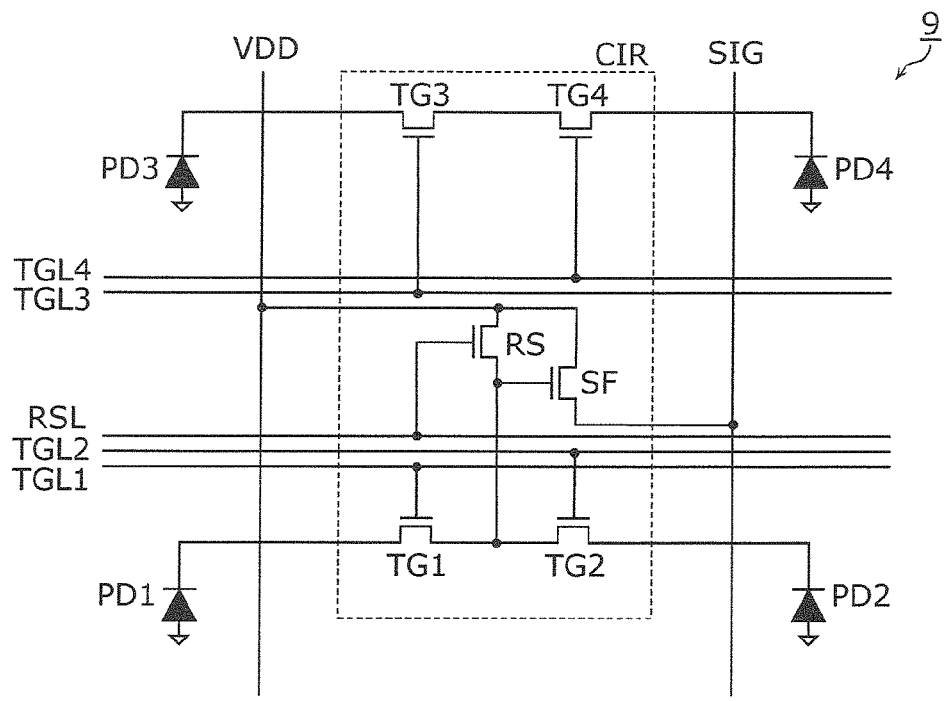
FIG. 15 is a circuit diagram of a pixel cell in a solid-state imaging device according to Embodiment 6.
Figure 16A:
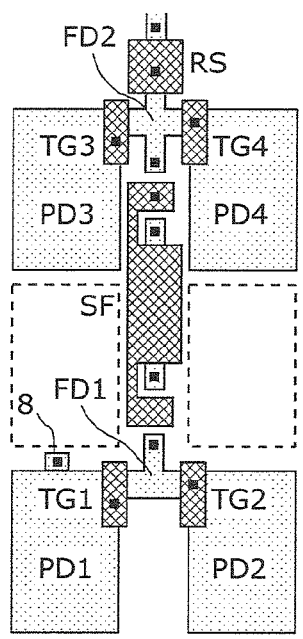
FIG. 16A is a layout diagram of active regions and polysilicon gates in a semiconductor substrate in a pixel cell according to Embodiment 6.
Figure 16B:
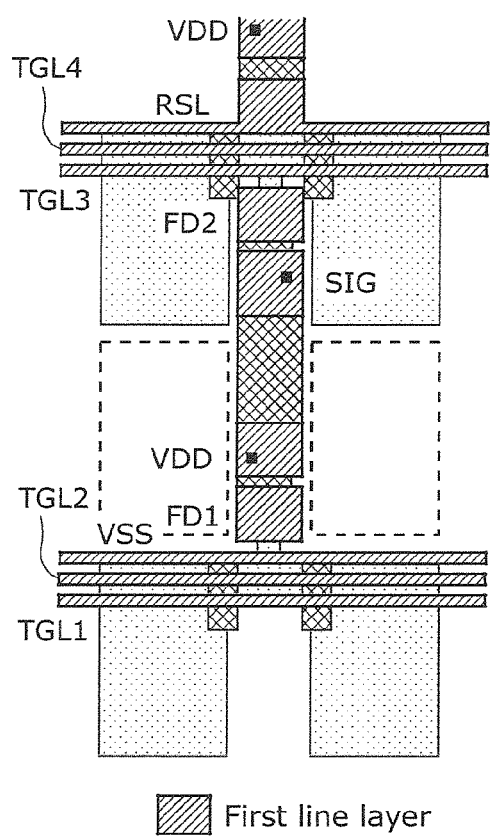
FIG. 16B is a layout diagram of a first line layer in an insulating film on the semiconductor substrate in a pixel cell according to Embodiment 6.
Figure 16C:
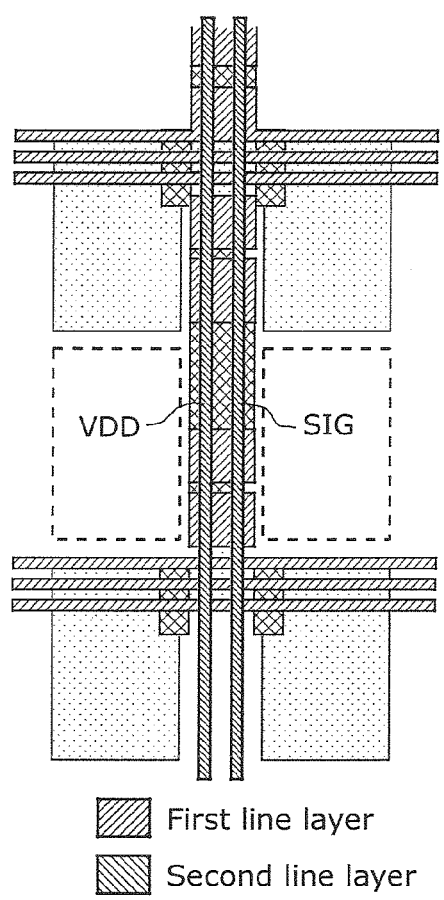
FIG. 16C is a layout diagram of a second line layer in an insulating film on the first line layer in a pixel cell according to Embodiment 6.

FIG. 15 is a circuit diagram schematically illustrating one of pixel cells in an imaging region of a solid-state imaging device according to Embodiment 6. Each of FIGS. 16A to 16C is a layout diagram illustrating structural elements arranged in a single pixel cell 9. FIG. 16A is a layout diagram of active regions of a semiconductor substrate and polysilicon gates on the semiconductor substrate in the pixel cell 9. FIG. 16B is a layout diagram of a first line layer in an insulating film on the semiconductor substrate in the pixel cell 9. FIG. 16C is a layout diagram of a second line layer in an insulating film on the first line layer in the pixel cell 9.

As illustrated in FIG. 16A, the pixel cell 9 includes: photodiodes PD1 and PD2 arranged in the row direction; photodiodes PD3 and PD4 arranged in the row direction; and an output circuit CIR between the photodiodes PD1 and PD2 and between the photodiodes PD3 and PD4. Here, the photodiodes PD3 and PD4 are provided in the same column of pixel cells as that including the photodiodes PD1 and PD2, but apart from the photodiodes PD1 and PD2 by two rows. Parts surrounded by broken lines are photodiodes included in a different pixel cell 9 adjacent to the above pixel cell 9. In other words, one pixel cell 9 includes: two photodiodes PD1 and PD2 adjacent in the row direction; and two photodiodes PD3 and PD4 adjacent in the row direction which are provided in the same column of pixel cells as that including the photodiodes PD1 and PD2 and apart from the photodiodes PD1 and PD2 with an interval of one row.

Transfer transistors TG1 and TG2 are formed for the photodiodes PD1 and PD2, respectively. A floating diffusion FD1 is shared by the photodiodes PD1 and PD2.

Likewise, transfer transistors TG3 and TG4 are formed for the photodiodes PD3 and PD4, respectively. A floating diffusion FD2 is shared by the photodiodes PD3 and PD4.

The floating diffusions FD1 and FD2 are connected to each other via a gate of an amplification transistor SF.

As illustrated in FIG. 16B, in the first line layer, there is a line connecting a source of the amplification transistor SF to the signal line SIG, and a line connecting a drain of the amplification transistor SF to the power source line VDD.

There are also transfer transistor control lines TGL1 to TGL4 extending in the row direction to be connected to the transfer transistors TG1 to TG4, respectively.

In the array arrangement, the pixel cells 9 are arranged in a houndstooth-like pattern, in which pixel cells 9 which are adjacent to each other in the column direction shift from each other in the row direction by one column of photodiodes.

In Embodiment 6, four photodiodes PD1 to PD4 can share a single output circuit CIR. Therefore, it is possible to increase a flexibility in arranging lines in comparison to Embodiment 1. In addition, it is possible to form a diffusion layer for substrate contacts 8, and form ground lines VSS in the first line layer.

(Embodiment 7)

Figure 17:
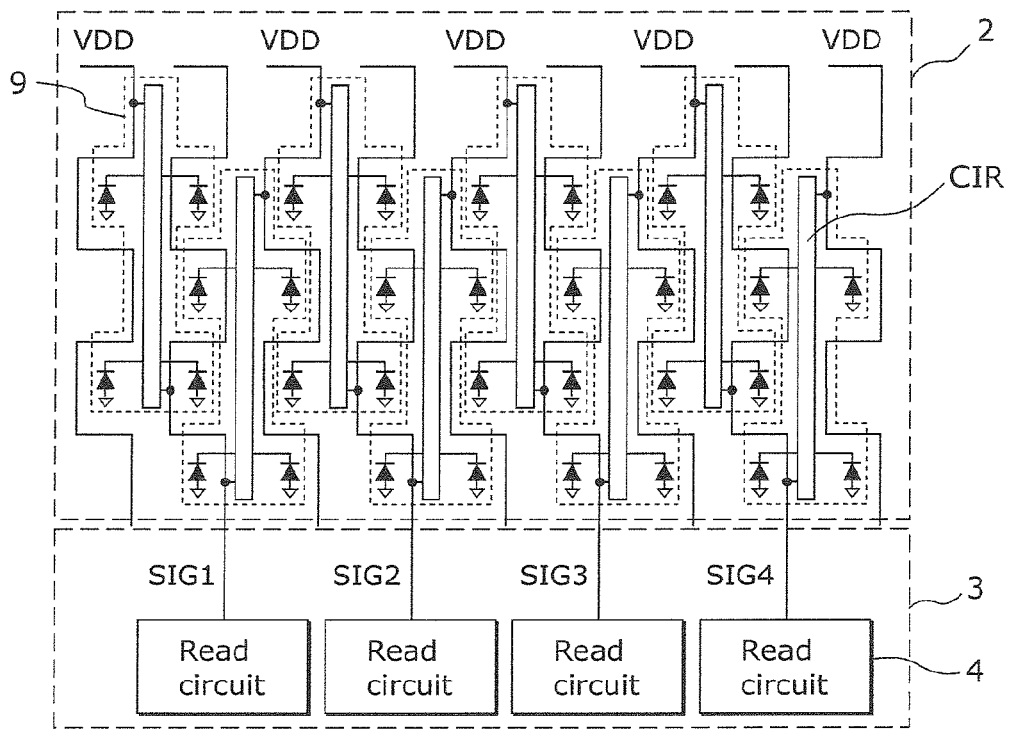
FIG. 17 is a circuit diagram of a pixel array in a solid-state imaging device according to Embodiment 7.

FIG. 17 is a circuit diagram illustrating pixel cells 9 arranged in an array in a solid-state imaging device according to Embodiment 7. In Embodiment 7, the pixel cells 9 are arranged in an array in the same manner as described in Embodiment 6, and the power source lines VDD and the signal lines SIG1 to SIG4 meander in the same manner as described in Embodiment 1.

In this case, as illustrated in FIG. 17, for each of the output circuits CIR, a position connected to the signal line (one of SIG1 to SIG4) and a position connected to the power source line VDD are in different rows. In short, each signal line SIG and each power source line VDD meander to be connected to the same output circuit CIR in different rows. As a result, the lines extending in the column direction are homogeneously arranged without being concentrated on specific positions.

Furthermore, each of the signal lines SIG connected to respective pixel cells 9 arrayed in the imaging region 2 is connected to a corresponding one of the read circuits 4 arranged in the peripheral circuit region 3 provided at the end of the pixel array in the column direction. Each of the read circuits 4 is provided for two columns of photodiodes. This structure can decrease the number of the read circuits 4 and reduce an area of the peripheral circuit region 3.

(Embodiment 8)

Figure 18:
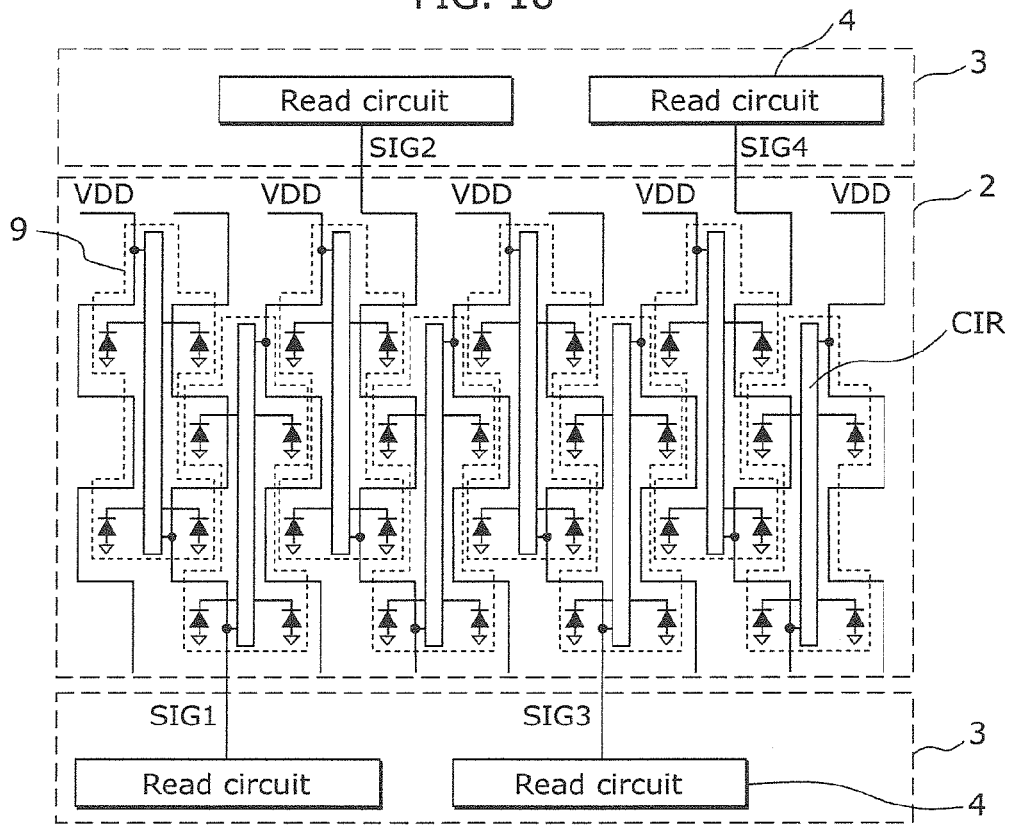
FIG. 18 is a circuit diagram of a pixel array in a solid-state imaging device according to Embodiment 8.

FIG. 18 is a circuit diagram illustrating pixel cells 9 arranged in an array in a solid-state imaging device according to Embodiment 8. Embodiment 8 differs from Embodiment 7 in that the pixel cells 9 are arranged in an array in the same manner as described in Embodiment 6, and the read circuits 4 are arranged above and under the pixel array and one read circuit 4 is provided for four columns of photodiodes in the same manner as described in Embodiment 2.

Since one read circuit 4 is provided for four columns of photodiodes, it is possible to further increase a flexibility in arranging the read circuits 4 and therefore further reduce an arrangement area of the read circuits 4. As a result, it is possible to further increase the number of products manufactured from one wafer, thereby further reducing a cost.

Although the read circuits 4 are arranged alternately above and under the pixel array in Embodiment 8, the arrangement of the read circuits 4 is not limited to this. It is also possible that the read circuits 4 are arranged alternately above and under the pixel array for every two signal lines SIG. Furthermore, although the same number of read circuits 4 are provided above and under the pixel array in Embodiment 8, it is also possible that the number of read circuits 4 above the pixel array is different from the number of read circuits 4 under the pixel array depending on how an AD converter provides outputs to the outside. The flexibility in the arrangement includes the above-described variation.

(Embodiment 9)

Figure 19:
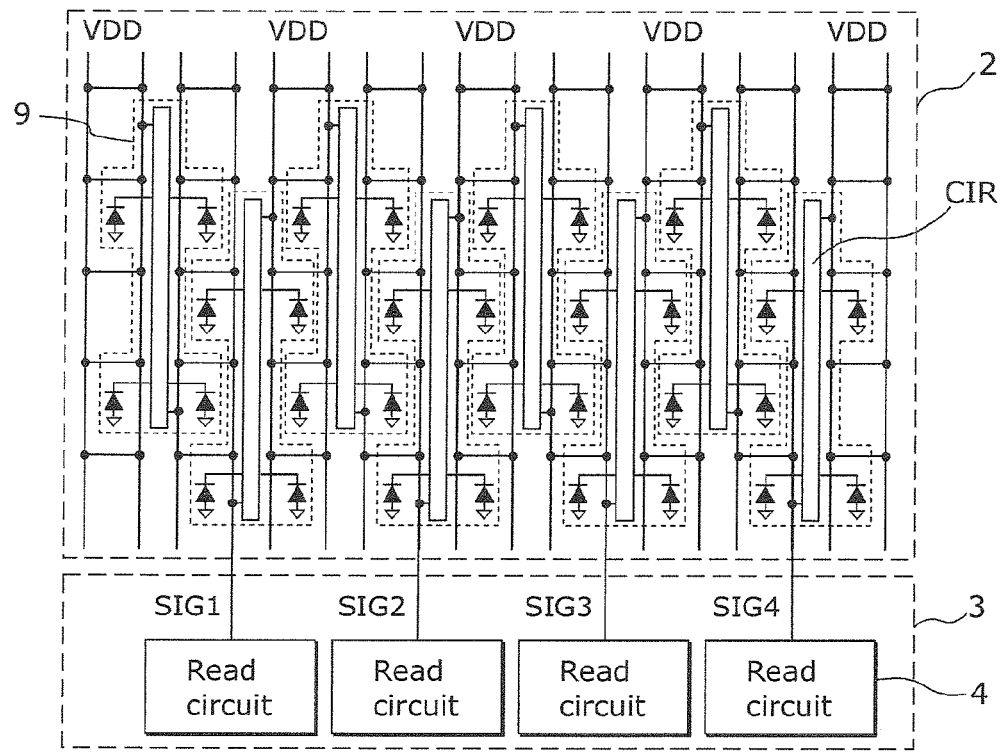
FIG. 19 is a circuit diagram of a pixel array in a solid-state imaging device according to Embodiment 9.

FIG. 19 is a circuit diagram illustrating pixel cells 9 arranged in an array in a solid-state imaging device according to Embodiment 9. Embodiment 9 differs from Embodiment 6 in that the pixel cells 9 are arranged in an array in the same manner as described in Embodiment 6, and the signal lines SIG1 to SIG4 and the power source lines VDD in the second line layer are arranged in a ladder pattern in the same manner as described in Embodiment 3.

Since the signal lines SIG1 to SIG4 and the power source lines VDD in the second line layer are arranged in a ladder patter, it is possible to reduce line resistance and increase a speed for reading.

(Embodiment 10)

Figure 20:
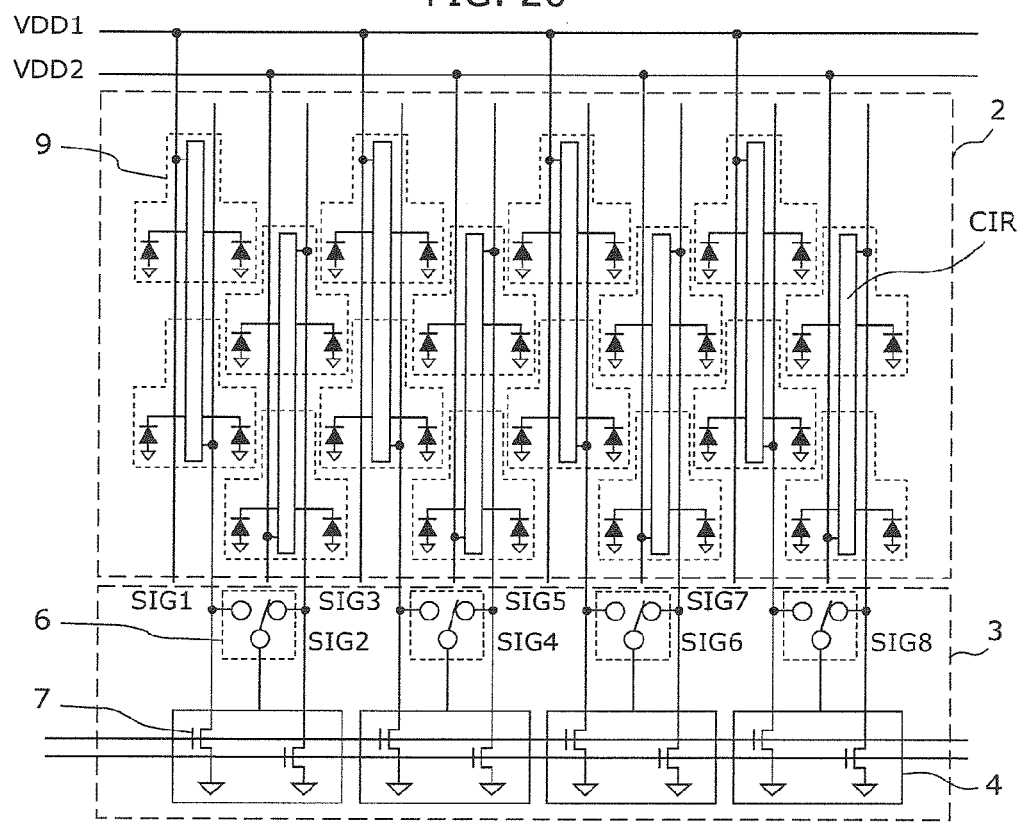
FIG. 20 is a circuit diagram of a pixel array in a solid-state imaging device according to Embodiment 10.

FIG. 20 is a circuit diagram illustrating pixel cells 9 arranged in an array in a solid-state imaging device according to Embodiment 10. In Embodiment 10, the pixel cells 9 are arranged in an array in the same manner as described in Embodiment 6 and the structure up to the first line layer is the same as that in Embodiment 4. However, in Embodiment 10, a signal line (one of SIG1 to SIG8) and a power source line VDD in the second line layer is provided for each column of photodiodes.

Furthermore, between each pair of the signal lines SIG1 to SIG8 and a corresponding one of the read circuits 4, there is a switch 6. Each of the switches 6 is provided for the two different signal lines (two of SIG1 to SIG8) to select a signal line to be used in reading, between the two different signal lines.

Moreover, each of the signal lines SIG1 to SIG8 is connected to a corresponding one of load transistors 7 in a corresponding one of the read circuits 4. Here, it is possible to control the load transistors 7 for each column.

Furthermore, the power source line VDD include power source lines VDD1 and power source lines VDD2. The power source line VDD1 and the power source line VDD2 are alternately arranged for each column.

The above structure can produce not only the effects of Embodiment 6 but also the effects of Embodiment 4.

(Embodiment 11)

Figure 21:
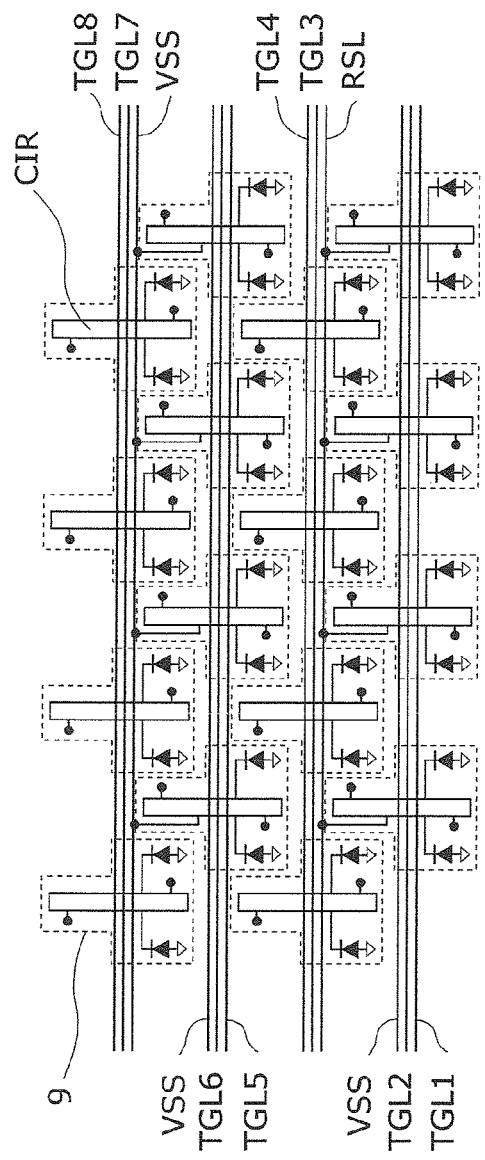
FIG. 21 is a circuit diagram of a pixel array in a solid-state imaging device according to Embodiment 11.

FIG. 21 is a circuit diagram illustrating pixel cells 9 arranged in an array in a solid-state imaging device according to Embodiment 11. In Embodiment 11, the pixel cells 9 are arranged in an array in the same manner as described in Embodiment 6, and a large number of ground lines VSS for substrate contacts 8 are provided in the same manner as described in Embodiment 5.

With the above structure, it is possible to provide more ground lines VSS for substrate contacts 8, thereby providing more reliable processing at a higher speed.

(Embodiment 12)

Figure 22A:
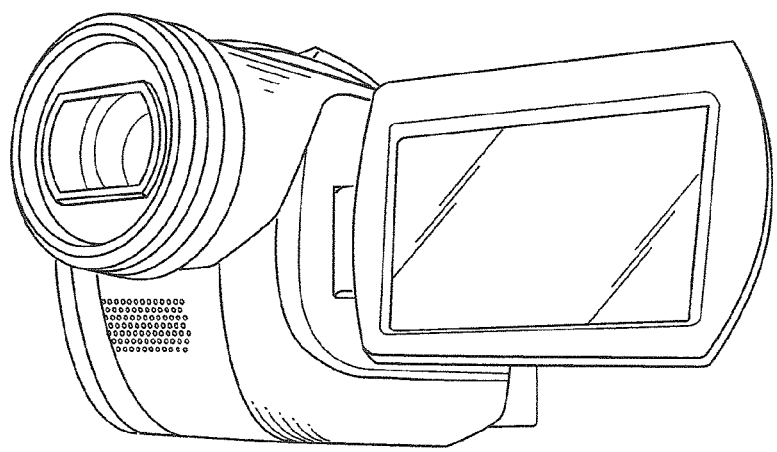
FIG. 22A is an external view illustrating an example of a video camera.
Figure 22B:
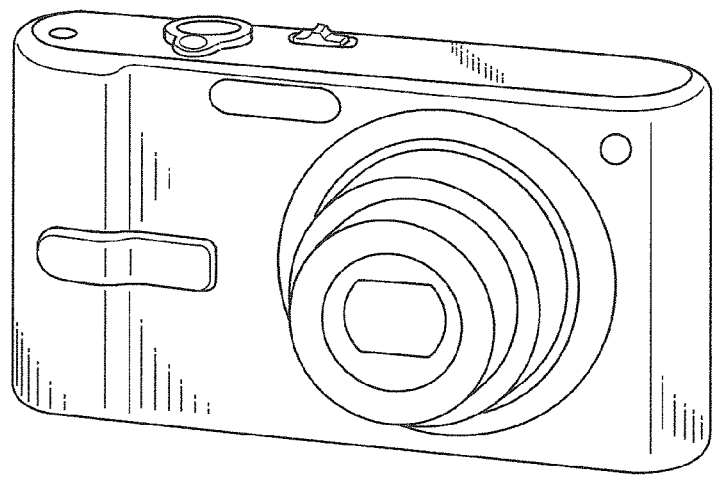
FIG. 22B is an external view illustrating an example of a digital still camera.

The solid-state imaging devices according to the above embodiments 1 to 11 and their variations are suitable as imaging devices (image input devices) in imaging apparatus such as a video camera illustrated in FIG. 22A, a digital still camera illustrated in FIG. 22B, a camera module for mobile devices including a mobile phone, and the like.

Figure 23:
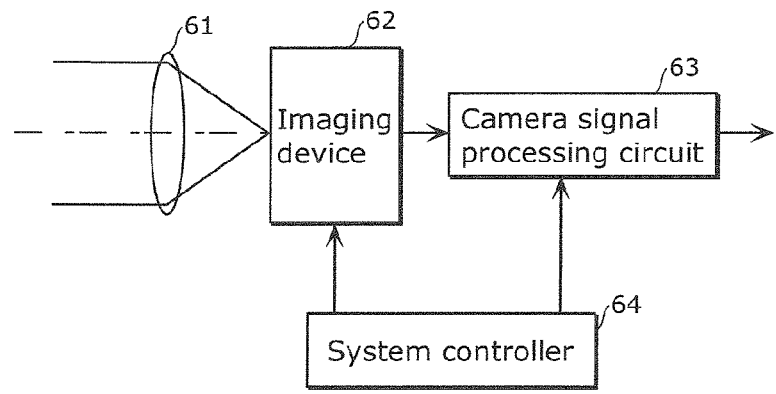
FIG. 23 is a block diagram illustrating an example of an imaging apparatus.
Figure 24:
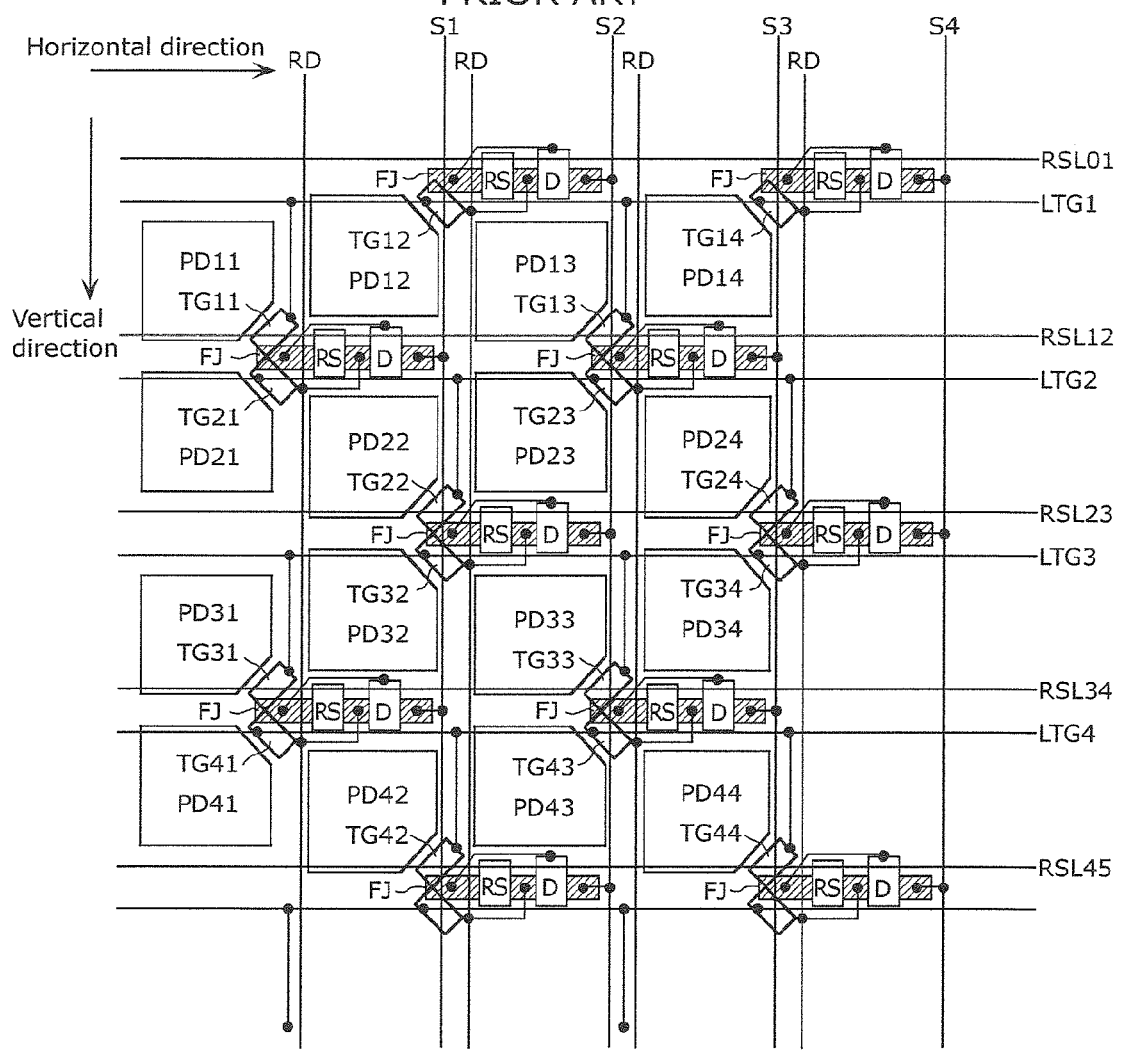
FIG. 24 is a plan view of a pixel array part in a conventional solid-state imaging device.

FIG. 23 is a block diagram illustrating an example of a structure of an imaging apparatus. As illustrated in FIG. 23, the image apparatus according to the present embodiment includes: an optical system including a lens 61; an imaging device 62; a camera signal processing circuit 63; a system controller 64; and the like. The lens 61 forms image of image light emitted from a subject, on an imaging area of the imaging device 62. The imaging device 62 converts the image light, which has been formed as the image by the lens 61, into electric signals for each pixel, thereby generating an image signal. The imaging device 62 is the solid-state imaging device according to any one of the above-described embodiments 1 to 11 and their variations.

The camera signal processing circuit 63 performs various signal processes on the image signals provided from the imaging device 62. The system controller 64 controls the imaging device 62 and the camera signal processing circuit 63.

Thus, the imaging apparatus according to the present embodiment includes the imaging device 62 capable of decreasing the lines in the imaging region, thereby refining the pixels and reducing a cost.

(Others)

The above-described Metal-Oxide-Semiconductor (MOS) solid-state imaging device is an example for facilitating understanding of the structure and the advantageous effects of the present disclosure. The present disclosure is not limited to the above-described Embodiments 1 to 11 and the like as long as the essential features are included.

For example, although the structure in which two photodiodes share a single output circuit (so-called two-pixel one-cell structure) and the structure in which four photodiodes share a single output circuit (four-pixel one-cell structure) have been described as examples in the above, it is also possible to provide other multi-pixel one-cell structures in which more photodiodes share a single output circuit, in order to refining pixels keeping the same sensitivity.

It should also be noted that the expression "in the row direction" in the above-described embodiments refers to a direction along which a given row extends, and the expression "in the column direction" in the above-described embodiments refers to a direction along which a given column extends.

INDUSTRIAL APPLICABILITY

The present disclosure is useful for digital still cameras, digital video cameras, medical cameras, monitor cameras, image recognition systems, and the like in which a solid-state imaging device is used.

The invention claimed is:

1. A solid-state imaging device, comprising:
a semiconductor substrate that includes an imaging region and a peripheral circuit region;
a plurality of photodiodes arranged in rows and columns in the imaging region;
a plurality of output circuits provided in the imaging region to transfer electric charges photoelectrically converted in the photodiodes and output pixel signals corresponding to the electric charges to outside of the imaging region;
a read circuit provided in the peripheral circuit region to read the pixel signals from the imaging region; and
a plurality of signal lines extending in a column direction above the semiconductor substrate to transfer the pixel signals,
wherein each of the signal lines connects two or more output circuits among the output circuits to the read circuit,
two photodiodes adjacent at least in a row direction among the photodiodes and an output circuit among the output circuits are included in a corresponding one of pixel cells,
the pixel cells include a first pixel cell and a second pixel cell, the first pixel cell and the second pixel cell being adjacent to each other in a column direction and shifting from each other by one column of the photodiodes in the row direction, and
the output circuit in the first pixel cell is adjacent to the second pixel cell in the row direction.

2. The solid-state imaging device according to claim 1, wherein the signal lines include a first signal line and a second signal line, the first signal line being connected to the output circuit in the first pixel cell, and the second signal line being connected to the output circuit in the second pixel cell, and
the read circuit is connected to both the first signal line and the second signal line.

3. The solid-state imaging device according to claim 2, wherein the first signal line and the second signal line are connected to each other via a bridge line extending in the row direction above photodiodes adjacent in the column direction among the photodiodes.

4. The solid-state imaging device according to claim 2, wherein the first signal line is connected to a first load transistor, and the second signal line is connected to a second load transistor, and
the solid-state imaging device further comprises
a switch between the read circuit and a pair of the first signal line and the second signal line, the switch selecting between the first signal line and the second signal line to be connected to the read circuit.

5. The solid-state imaging device according to claim 2, further comprising:
a switch between the read circuit and a pair of the first signal line and the second signal line, the switch selecting between the first signal line and the second signal line to be connected to the read circuit; and
a load transistor between the switch and the read circuit.

6. The solid-state imaging device according to claim 1, wherein the output circuit in the first pixel cell and the output circuit in the second pixel cell are connected to a same signal line among the signal lines.

7. The solid-state imaging device according to claim 6, further comprising
a plurality of power source lines each extending in the column direction above the semiconductor substrate and connected to two or more output circuits of the output circuits,
wherein the output circuit in the first pixel cell and the output circuit in the second pixel cell are connected to a same power source line among the power source lines.

8. The solid-state imaging device according to claim 7, further comprising
an auxiliary power source line extending in the row direction above the semiconductor substrate,
wherein the auxiliary power source line is connected to a corresponding one of the power source lines.

9. The solid-state imaging device according to claim 1, wherein a plurality of read circuits including the read circuit are arranged in two or more peripheral circuit regions including the peripheral circuit region, the two or more peripheral circuit regions facing each other with the imaging region therebetween.

10. The solid-state imaging device according to claim 1, further comprising
a plurality of reset lines each extending in the row direction above the semiconductor substrate and connected to two or more output circuits of the output circuits,
wherein the output circuit in the first pixel cell and the output circuit in the second pixel cell are connected to a same reset line among the reset lines.

11. The solid-state imaging device according to claim 10, further comprising
a ground line extending in the row direction above the semiconductor substrate and connected to a region in the imaging region, the region being not a region where the output circuits and the photodiodes are arranged,
wherein the ground line is provided in a row different from the row provided with the reset lines.

12. The solid-state imaging device according to claim 1, further comprising:
 a first power source line extending in the column direction above the semiconductor substrate and connected to two or more output circuits of the output circuits; and
 a second power source line extending in the column direction and connected to two or more output circuits of the output circuits, wherein the first power source line and the second power source line are arranged alternately in the row direction to be connected to different output circuits among the output circuits, and different power source voltages are applied to the first power source line and the second power source line independently.

13. The solid-state imaging device according to claim 1, wherein each of the pixel cells includes:
 the two photodiodes adjacent at least in the row direction; and
 different two photodiodes arranged in a column including the two photodiodes, the different two photodiodes being apart from the two photodiodes in the column direction with an interval of one row of the photodiodes.

14. The solid-state imaging device according to claim 1, wherein each of the output circuits further includes
 two transfer transistors each provided to a corresponding one of the two photodiodes adjacent at least in the row direction in the pixel cell, and
 the solid-state imaging device further comprises
 two transfer transistor control lines extending in the row direction above the semiconductor substrate and each provided for a corresponding one of the two transfer transistors.

15. An imaging apparatus comprising
 the solid-state imaging device according to claim 1.

* * * * *